US010921376B2

(12) United States Patent
Schmid-Schoenbein et al.

(10) Patent No.: US 10,921,376 B2
(45) Date of Patent: Feb. 16, 2021

(54) SENSOR APPARATUS FOR MONITORING AT LEAST ONE BATTERY CELL (71) Applicant: Robert Bosch GmbH, Stuttgart (DE)

(72) Inventors: Christian Schmid-Schoenbein, Stuttgart (DE); David Rychtarik, Schwieberdingen (DE); Hang Yu, Magstadt (DE); Walter Jasch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 324 days.

(21) Appl. No.: 15/996,609

(22) Filed: Jun. 4, 2018

(65) Prior Publication Data
US 2018/0348305 A1 Dec. 6, 2018

(30) Foreign Application Priority Data

Jun. 2, 2017 (DE) .................. 10 2017 209 413.3

(51) Int. Cl.
| | |
|---|---|
| *G01N 27/416* | (2006.01) |
| *G01R 31/382* | (2019.01) |
| *G01K 13/00* | (2021.01) |
| *G01R 31/36* | (2020.01) |
| *G01K 1/14* | (2021.01) |
| *G01R 1/04* | (2006.01) |

(Continued)

(52) U.S. Cl.
CPC ............ *G01R 31/382* (2019.01); *G01K 1/14* (2013.01); *G01K 13/00* (2013.01); *G01R 1/0416* (2013.01); *G01R 31/36* (2013.01); *G01R 31/364* (2019.01); *G01R 31/3644* (2013.01); *G01R 31/385* (2019.01); *G01R 31/3835* (2019.01); *G01K 2205/00* (2013.01); *H01L 2224/05155* (2013.01); *H01L 2224/05171* (2013.01); *H01L 2224/05624* (2013.01); *H01L 2924/00014* (2013.01)

(58) Field of Classification Search
CPC . H01L 2924/00014; H01L 2224/05155; H01L 2224/05171; H01L 2224/05624; G01R 31/364; G01R 31/385; G01R 31/3835; G01R 31/36
USPC .................. 324/76.11–76.83, 425, 426, 437
See application file for complete search history.

(56) References Cited

U.S. PATENT DOCUMENTS

| | | | | |
|---|---|---|---|---|
| 2014/0333314 | A1* | 11/2014 | Kaupp | G01R 1/203 324/426 |
| 2015/0054518 | A1* | 2/2015 | Henrici | B60L 58/14 324/426 |

(Continued)

FOREIGN PATENT DOCUMENTS

DE 102014118188 A1 6/2016

OTHER PUBLICATIONS

DE 102012223756 Machine Translation, Jun. 26, 2014 (Year: 2014).*

*Primary Examiner* — Raul J Rios Russo
(74) *Attorney, Agent, or Firm* — Michael Best & Friedrich LLP (57) ABSTRACT A sensor apparatus (10) for monitoring at least one battery cell (20) of a battery system (100), having a sensor element (11) for detecting at least one state variable of the battery cell (20), at least one electrically and/or thermally conductive connecting element (12) connected to the sensor element (11) so that the sensor element can be connected to the battery cell (20) and to an electronic unit (30) of the battery system (100), wherein the connecting element (12) is formed as a flexible printed circuit board (12).

20 Claims, 6 Drawing Sheets (51) Int. Cl.
*G01R 31/364* (2019.01)
*G01R 31/385* (2019.01)
*G01R 31/3835* (2019.01)

(56) References Cited

U.S. PATENT DOCUMENTS

| | | | |
|---|---|---|---|
| 2017/0187077 A1* | 6/2017 | McCartney | H01M 10/486 |
| 2017/0263568 A1* | 9/2017 | Jeon | H01L 21/4889 |
| 2018/0009328 A1* | 1/2018 | Hinterberger | H02J 7/00047 |
| 2018/0106869 A1* | 4/2018 | Gelso | G01R 19/16542 |
| 2018/0241094 A1* | 8/2018 | Hinterberger | H01M 2/1077 |

* cited by examiner

SENSOR APPARATUS FOR MONITORING AT LEAST ONE BATTERY CELL

BACKGROUND OF THE INVENTION

The present invention relates to a sensor apparatus and to a battery system.

Temperature sensors are known from the prior art, wherein the sensor apparatuses have a sensor element comprising connection lines, each of which is secured to a corresponding electrode on a temperature detection element. DE 100 15 831 A1 shows a sensor apparatus of this kind.

SUMMARY OF THE INVENTION

According to a first aspect of the invention, a sensor apparatus for monitoring at least one battery cell of a battery system is claimed. The sensor apparatus has a sensor element for detecting at least one (physical and/or chemical) state variable of the battery cell and at least one electrically and/or thermally conductive connecting element connected to the sensor element so that the sensor element can be connected to the battery cell and to an electronic unit of the battery system. The connecting element is formed as a flexible printed circuit board; in particular, the flexible printed circuit board is formed, at least longitudinally, in an elastic manner. In the context of the invention, a flexible printed circuit board can be a cable formed with a plurality of cores (FFC) comprising a plurality of lines or a printed circuit on a flexible plastics carrier (FPC). The plastics carrier can preferably comprise polyimide, Mylar, nylon and/or polyester film. Copper or silver is conceivable as conductor material; the contact regions can also be flash plated for enhanced demands. In particular, the lines can be arranged alongside one another in a parallel and electrically insulated manner and can be formed as signal lines. A flexible printed circuit board according to the invention can compensate for tolerances or movements related to components or induced by mechanical influences. Generic sensor apparatuses are installed in battery systems. The electrically and/or thermally conductive connecting element is connected at a first end thereof to an electronic unit, for example in the form of a PCB board. PCB boards of this kind have certain production-related tolerances and are generally mounted on structural components, for example a cover of a battery system. The installation position of the battery systems is consequently afflicted by tolerances, wherein the spacing between the electronic unit and the battery cell can vary accordingly. A sensor apparatus according to the invention can compensate for such tolerances by virtue of the connecting element being formed as a flexible printed circuit board. In particular, the flexible printed circuit board is formed, in terms of its length and thus longitudinally, in an elastic and/or flexible manner. An electronic unit of a battery system can in this case be, for example, a battery management system (BMS) and/or a cell supervision circuit (CSC). The flexible printed circuit board according to the invention is connected in this case at another end to a sensor element so that the sensor element is pressed onto the battery cell, in particular onto the terminal of a battery cell, on account of the flexible configuration. The flexible printed circuit board is preferably formed in such a way that a spring force can be generated by the geometric shape of the printed circuit board so that the sensor element can be brought into contact with the battery cell. The sensor element of the sensor apparatus according to the invention can be formed, for example, as a temperature sensor so that the invention can also involve a temperature sensor apparatus. In this case, the sensor element can be formed as an electrical or electronic component, in particular a semiconductor component, so that an electrical signal as a measure for the temperature, for example, can be transmitted to an electronic unit. It is conceivable for the sensor element (for example the semiconductor temperature sensor) to be integrated in the connecting element or to be arranged thereon in a force-fitting and/or form-fitting manner at least in sections. Furthermore, the sensor element can be signal-connected to a sensor unit arranged on the battery cell, preferably on the terminal of a battery cell. In the context of the invention, the sensor element can be formed as a passive or an active component. The sensor element can be formed as a hot conductor, cold conductor or semiconductor temperature sensor element. It is likewise conceivable for the sensor element to be formed as a thermocouple, a ferromagnetic temperature sensor element or as a fiber-optic temperature sensor. The flexible printed circuit board is preferably formed with a plurality of cores; in particular, it can be formed in a material-bonded manner, for example soldered or welded, to the sensor element. The sensor element can preferably be formed in a manner integrated in the flexible printed circuit board, in particular in one piece with the flexible printed circuit board.

Further features and details of the invention emerge from the dependent claims, the description and the drawings. In this case, it goes without saying that features and details, which have been described in connection with the apparatus according to the invention, naturally also apply in connection with the system according to the invention and/or the method according to the invention and vice versa in each case, with the result that reference is or can be always reciprocally made with respect to the disclosure relating to the individual aspects of the invention.

The flexible printed circuit board can advantageously have at least one spring element, wherein, in particular, the spring element and the flexible printed circuit board are formed in one piece. The spring element can press the sensor element against the battery cell, in particular a terminal of the battery cell. The contact between the sensor element and the battery cell can thus be ensured in spite of production-related and/or movement-related tolerances. In this case, the spring element makes it possible to achieve tolerance compensation in at least the longitudinal direction of the connecting element. The spring element can comprise a plastic and/or metal. It is further conceivable for the spring element to be formed by the flexible printed circuit board. For this, the flexible printed circuit board can be shaped and/or reshaped in such a way that the connecting element can be elastically deformed. The flexible printed circuit board can thus store potential energy. The spring element can provide a constant restoring force so that the sensor element is pressed onto the battery cell, in particular onto the terminal of the battery cell. The spring element can comprise a steel, in particular spring steel and/or copper alloys, in particular can be formed as a semi-finished product, for example as a narrow strip and/or wire. Furthermore, it is conceivable for the spring element to comprise rubber or plastic.

The spring element and the flexible printed circuit board can advantageously be formed at least in a force-fitting, material-bonded and/or form-fitting manner. This can achieve a compact physical shape, wherein the flexible printed circuit board and the spring element are simultaneously formed in a mechanically stable and flexible manner with respect to one another. A force fit can be produced, for example, by drilling or additional securing means. The spring element and the flexible printed circuit board can be connected to one another in a material-bonded and/or form-fitting manner by injection-molding and/or adhesive bonding and/or welding.

It is conceivable for the flexible printed circuit board and/or the spring element to be of helical, spiral or z-shaped form. The shape of the spring element makes it possible for it to be formed in a compact manner in the relaxed state and for it to compensate for tolerances, in particular in the longitudinal direction, in the event of having a tensile force or a pressure force applied to it and thus in the event of the connecting element pulling apart or being compressed.

It is furthermore advantageous when an insulation element is provided so that the flexible printed circuit board is at least electrically isolated, in particular with respect to the spring element. The insulation element preferably serves as protection against a short circuit of the flexible printed circuit board with a further component of the battery cell or of the battery system. It is further conceivable for the insulation element to be able to reduce interference influences, in particular electrical or electromagnetic interference influences. The insulation element can in this case be formed at least in sections, preferably over the entire length of the printed circuit board. It is conceivable for the insulation element to comprise a plastic and, in particular, to be arranged in a form-fitting manner on the spring element and/or on the flexible printed circuit board. It can be preferred when the insulation element is formed in a film-like manner, in particular, comprising a thermoplastic. The insulation element can encase the individual cores of the flexible printed circuit board at least in sections. The insulation element preferably has a material recess at the ends of the flexible printed circuit board at which the sensor element or the electronic unit is arranged.

There can also be provision for the spring element to at least partly or else completely comprise foam as material, wherein, in particular, the foam is elastic. Deformation of the foam in this case generates a restoring force, which is used as spring force. It can thus be advantageous when at least one spring element is of foamed form. The spring element that is of foamed form can preferably be of rectangular, cylindrical or trapezoidal form. In particular, the foamed spring element can comprise a plastic, preferably EPDM. It is conceivable for the foamed spring element to be adhesively bonded, welded, latched or clipped to the flexible printed circuit board. Corresponding latching and/or clip elements can be present for this purpose. A spring element of foamed form can be arranged in a thermally, magnetically and/or electrically insulating manner between the battery cell and the electronic unit. Furthermore, a spring element of foamed form can compensate for component or movement tolerances. It is conceivable for the spring element of foamed form to have a recess for the sensor element. It is also conceivable for the spring element to be injected onto the printed circuit board of flexible form. The foamed spring element can preferably have a height, a cross section and/or a diameter between approximately 1 mm and approximately 30 mm, preferably between approximately 5 mm and approximately 15 mm. It can be advantageous when an insulation film is arranged on the sensor element, as a result of which the sensor element is electrically and/or thermally insulated at least in sections. The insulation film ensures that no voltage can be transmitted from the battery cell, for example, via the spring element. Furthermore, an insulation film can thermally insulate the spring element and the sensor element from one another so that no interference influences for the electronic unit and/or for the sensor element can negatively influence a measurement result. Consequently, it is possible for a state variable of the battery cell to be measured precisely and in a manner substantially free from interference influences. The insulation film can in this case be formed from a single material, in particular in a material-bonded manner or in one piece with the insulation element. The insulation film is advantageously formed by the insulation element.

It is conceivable for the connecting element to have a plug at least at its one end. The plug is preferably arranged at the end of the connecting element, which is signal-connected to the electronic unit. Consequently, the plug is formed on the connecting element preferably in such a way that it can be plugged onto the electronic unit before the electronic unit is mounted in the battery system. The connecting element can thus be connected to the electronic unit in a force-fitting and/or form-fitting manner. After the installation of the electronic unit in the battery system, the flexible printed circuit board can be brought into contact with the battery cell, in particular the terminal of the battery cell, on account of the spring force. In this case, the plug is preferably a pin-type plug connector, a soldering adapter or plug connector, in particular having a mounting aid. The plug makes it possible to mount the sensor apparatus on the battery system in a simple and cost-effective manner. The mounting aid can in this case be formed as a tool receptacle, as a result of which the mounting or the connection of the plug to the electronic unit can be improved.

The spring element and/or the flexible printed circuit board can advantageously have at least one latching connection, clip connection or clamping connection, as a result of which the spring element and the flexible printed circuit board can be connected in a force-fitting manner. In this case, the latching connection, clip connection or clamping connection can be formed on the spring element and/or on the flexible printed circuit board. The spring element can advantageously have such a connection at least in sections. In this case, it is conceivable for the spring element to be formed as a stamped part and to have lugs at least in sections, which can be bent around the flexible printed circuit board after the flexible printed circuit board has been mounted on the spring element.

It is preferred when the insulation element and/or the insulation film comprise at least plastic and/or ceramic. A plastic makes electrical and/or thermal insulation possible and is cost-effective and simple to produce. A ceramic has good thermal and electrical insulation; in particular, a ceramic is not sensitive to higher temperatures. In particular, an insulation element and/or an insulation film, comprising a ceramic, on the sensor element can be advantageous since influences caused by temperatures, in particular high temperatures, can be substantially prevented.

According to a second aspect of the invention, a battery system for storing electrical energy and for supplying electrical energy to an electric motor of a motor vehicle is claimed. The battery system has at least one battery cell, an electronic unit for monitoring the battery system and at least one sensor apparatus for monitoring at least one battery cell. Here, the sensor apparatus has a sensor element for detecting a state variable of the battery cell, at least one electrically and/or thermally conductive connecting element for connecting the sensor element to an electronic unit of the battery system, wherein the connecting element is formed as a flexible printed circuit board.

The sensor apparatus of the battery system is advantageously formed according to the invention. All of the advantages that have already been described in connection with the sensor apparatus according to the invention thus result for the battery system.

Further measures that improve the invention result from the following description of some exemplary embodiments of the invention, which are schematically illustrated in the figures. All of the features and/or advantages, including structural details and spatial arrangements, emerging from the claims, the description or the drawings can be essential to the invention both on their own and also in an extremely wide variety of combinations. It should be noted here that the figures are merely descriptive and are not intended to limit the invention in any way.

BRIEF DESCRIPTION OF THE DRAWINGS

In the following figures, identical reference symbols are used for the same technical features, even of different exemplary embodiments. In the figures.

DETAILED DESCRIPTION

Figure 1:
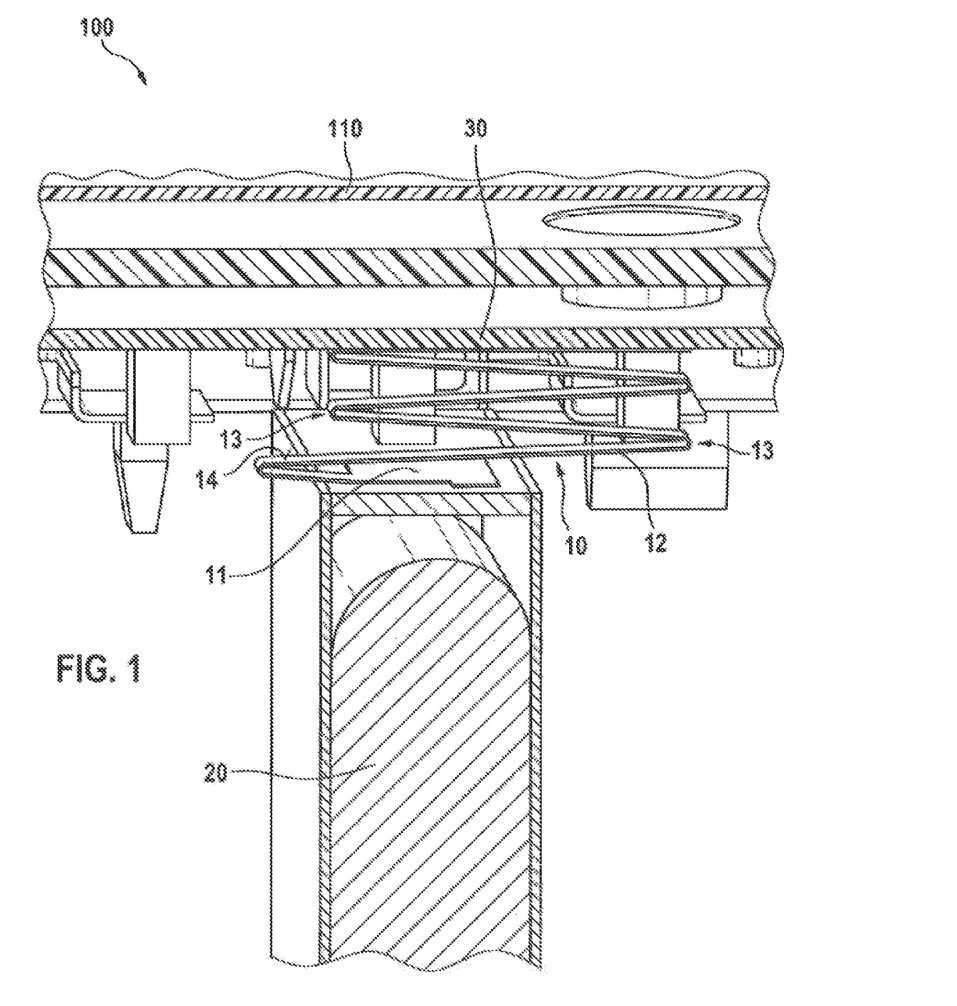
FIG. 1 shows a first embodiment of a battery system according to the invention comprising a sensor apparatus according to the invention.

FIG. 1 shows a first possible embodiment of the battery system 100 according to the invention for storing electrical energy and for supplying electrical energy to an electric motor of a motor vehicle. The battery system 100 has at least one battery cell 20, an electronic unit 30 for monitoring the battery system 100 and a sensor apparatus 10 for monitoring the at least one battery cell 20. The sensor apparatus 10 according to the invention has a sensor element 11 for detecting a state variable of the battery cell 20, wherein at least one electrically and/or thermally conductive connecting element 12 connects the sensor element 11 to an electronic unit 30 of the battery system 100 and wherein the connecting element 12 is formed as a flexible printed circuit board 12. In FIG. 1, the electronic unit 30 is formed as a printed circuit board (PCB) and is arranged on a cover 110 of the battery system 100. The electronic unit 30 is signal-connected to the battery cell 20 by means of the connecting element 12, wherein the connecting element 12 is formed as a substantially z-shaped flexible printed circuit board. The flexible printed circuit board 12 formed in a substantially z-shaped manner forms spring elements 13 at the kinks of the flexible printed circuit board 12, with the result that, on the one hand, the z-shaped geometry of the flexible printed circuit board 12 and, at the same time, spring properties are formed. Consequently, the sensor element 11 is pressed onto the battery cell 20, in particular the terminal of the battery cell 20. At the other end of the flexible printed circuit board 12, said end is connected to the electronic unit 30 in a force-fitting and/or form-fitting manner so that the resulting spring force can support the flexible printed circuit board 12 on the electronic unit 30 and is pressed in the direction of the battery cell 20. In FIG. 1, the sensor element 11 is arranged on the flexible printed circuit board 12 and is formed in one piece therewith. In this case, the sensor element 11 can be integrated in the flexible printed circuit board 12. The flexible printed circuit board 12 is preferably formed with a plurality of cores and is encased by an insulation element 14, in particular a film-like insulation element 14.

Figure 2:
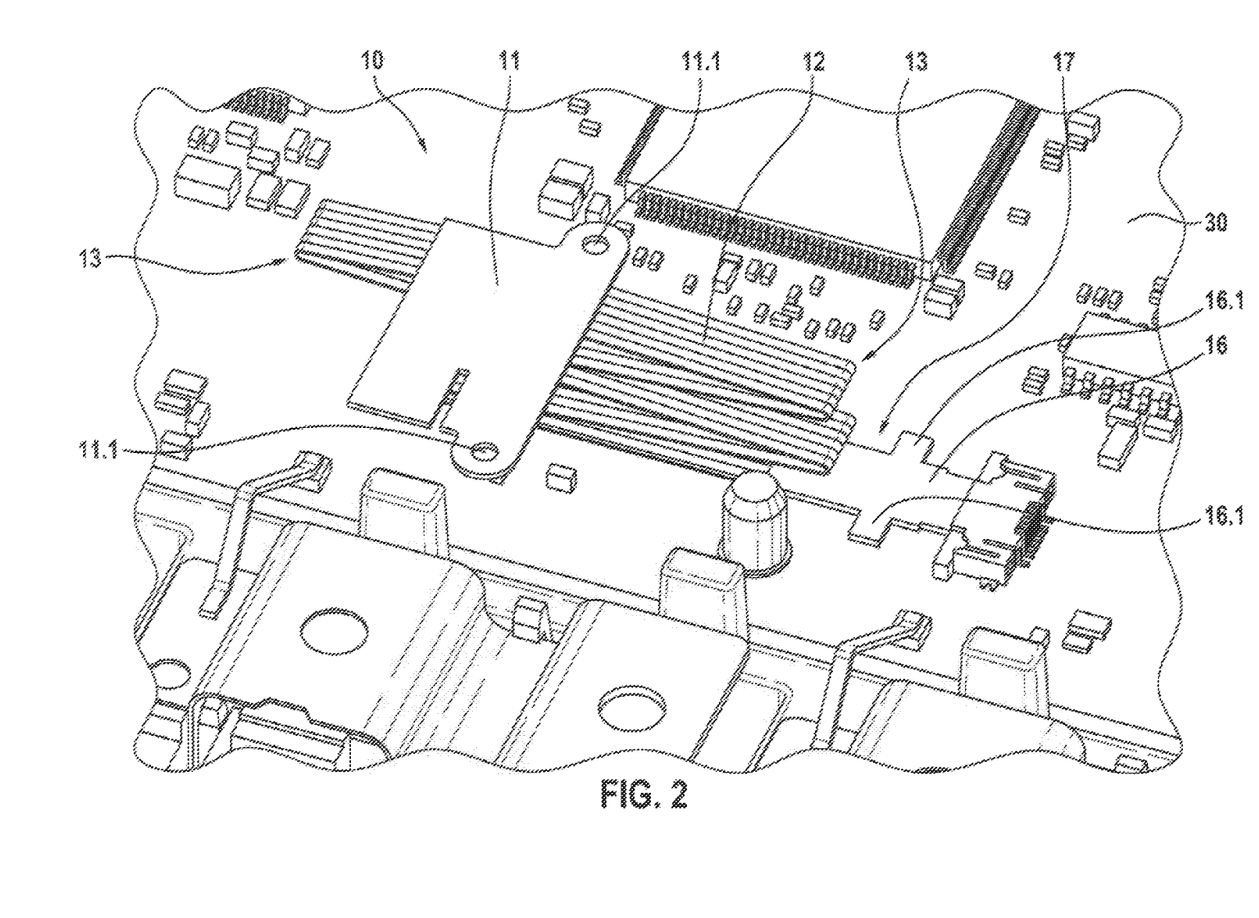
FIG. 2 shows one possible embodiment of a sensor apparatus according to the invention.

FIG. 2 shows a further embodiment of a sensor apparatus 10 according to the invention. In FIG. 2, the sensor apparatus 10 has a connecting element 12, which, as a flexible printed circuit board 12, is formed in a substantially z-shaped manner. The flexible printed circuit board 12 is furthermore formed with a plurality of cores and has a sensor element 11 at its first end and a plug 16 at its second end 17, wherein the plug 16 is arranged on the electronic unit 30 in a plug receptacle in a force-fitting and/or form-fitting manner. In FIG. 2, the plug 16 of the sensor apparatus 10 has a tool receptacle 16.1, wherein the tool receptacle simplifies mounting of the sensor apparatus 10 on the electronic unit 30. It is thus possible, when mounting the sensor apparatus 10 on the electronic unit 30, to fix a tool, for example a pair of pliers, to the tool receptacle 16.1, which is formed in FIG. 2 as two laterally arranged lugs, as a result of which simplified plugging of the plug 16 into a plug receptacle of the electronic unit 30 is made possible. The substantially z-shaped flexible printed circuit board 12 formed with a plurality of cores has a sensor element 11 at its first end, which sensor element is formed in one piece with the flexible printed circuit board 12. The sensor element 11 likewise has a tool receptacle 11.1, wherein the tool receptacle 11.1 of the sensor element 11 likewise simplifies mounting of the sensor element 11 on the battery cell 20, in particular a terminal of the battery cell 20. The tool receptacles 11.1 of the sensor element 11 are in this case shaped as bores of the sensor element 11 formed in a substantially planar manner. A second tool receptacle 11.1 is in this case formed in the sensor element 11 in a linear manner, for example in a slot-shaped manner, and likewise makes simplified mounting of the sensor element and thus the sensor apparatus 10 on a battery cell 20 possible. The plug 16 on the second end 17 of the flexible printed circuit board 12 and the sensor element 11 are formed in one piece with the flexible printed circuit board 12. In this case, it is conceivable for the sensor element 11 to be welded or soldered or crimped to the flexible printed circuit board 12 formed with a plurality of cores. In FIG. 2, the plug 16 is formed as a flat plug and can preferably be plugged into the electronic unit 30 first when the sensor apparatus 10 is mounted. The electronic unit 30 is preferably arranged in a cover of the battery system, for example hooked in or screwed thereto, so that, when the cover of the battery system is mounted, the sensor element 11 is pressed onto the battery cell 20 on account of the flexible printed circuit board formed in a z-shaped manner. The spring elements 13 form at the kinks of the flexible printed circuit board 12 on account of the z-shaped configuration of the connecting element 12.

Figure 3:
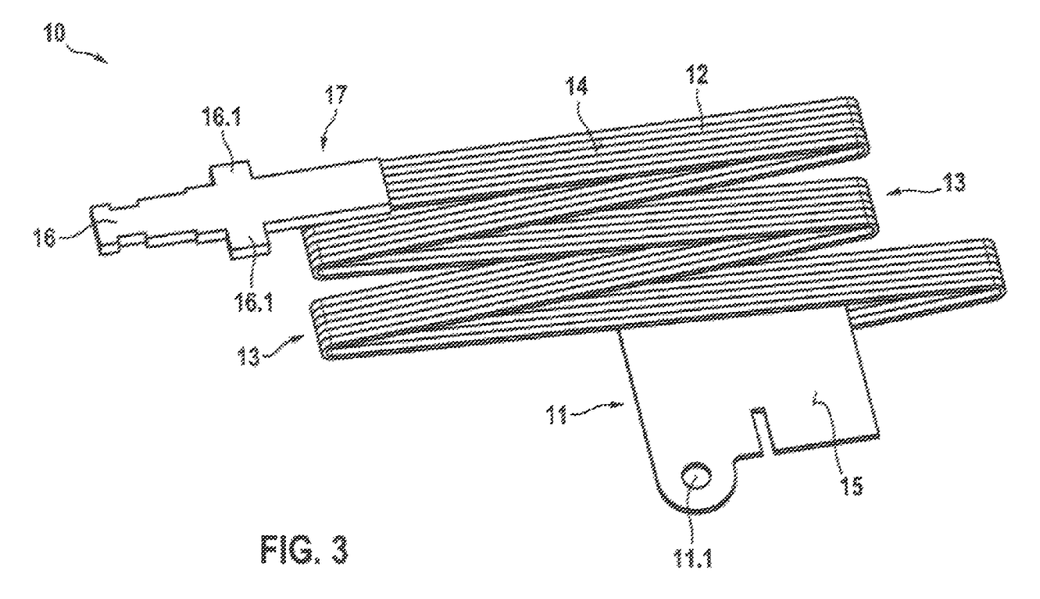
FIG. 3 shows a further possible embodiment of a sensor apparatus according to the invention.

FIG. 3 shows a three-dimensional view of a further embodiment of a sensor apparatus 10 according to the invention. In this case, the sensor apparatus 10 has, on its second end 17, a plug 16, a connecting element 12 in the form of a flexible printed circuit board 12 formed with a plurality of cores (a plurality of lines is meant) as well as a sensor element 11, wherein the individual lines (e.g. 6 lines here) can be clearly recognized alongside one another. In FIG. 3, the flexible printed circuit board 12 is formed with a plurality of cores and in a substantially z-shaped manner, wherein spring elements 13 form at the kinks of the flexible printed circuit board 12. In FIG. 3, the sensor element 11 has an insulation film 15 so that the sensor element 11 is electrically and/or thermally insulated. The sensor element 11 is electrically connected to the flexible printed circuit board 12 so that state variables of a battery cell 20 can be transmitted from the sensor element 11 via the connecting element 12 formed as a flexible printed circuit board 12 to an electronic unit 30. In FIG. 3, the flexible printed circuit board 12 has an insulation element 14 so that the flexible printed circuit board 12 is at least electrically and/or thermally insulated. The insulation element 14 is preferably formed in a film-like manner and in a form-fitting manner with the flexible printed circuit board 12 having a plurality of cores; in particular, the individual cores of the flexible printed circuit board 12 are each individually surrounded by the insulation element 14. It is conceivable for the insulation element 14 to be formed in a film-like manner and in one piece with the insulation film 15. On the sensor element 11, a tool receptacle 11.1 is arranged next to the insulation film 15. In this case, the insulation film 15 can at least electrically insulate a mounting tool, which can be arranged in the tool receptacle 11.1, with respect to the sensor element 11.

Figure 4A:
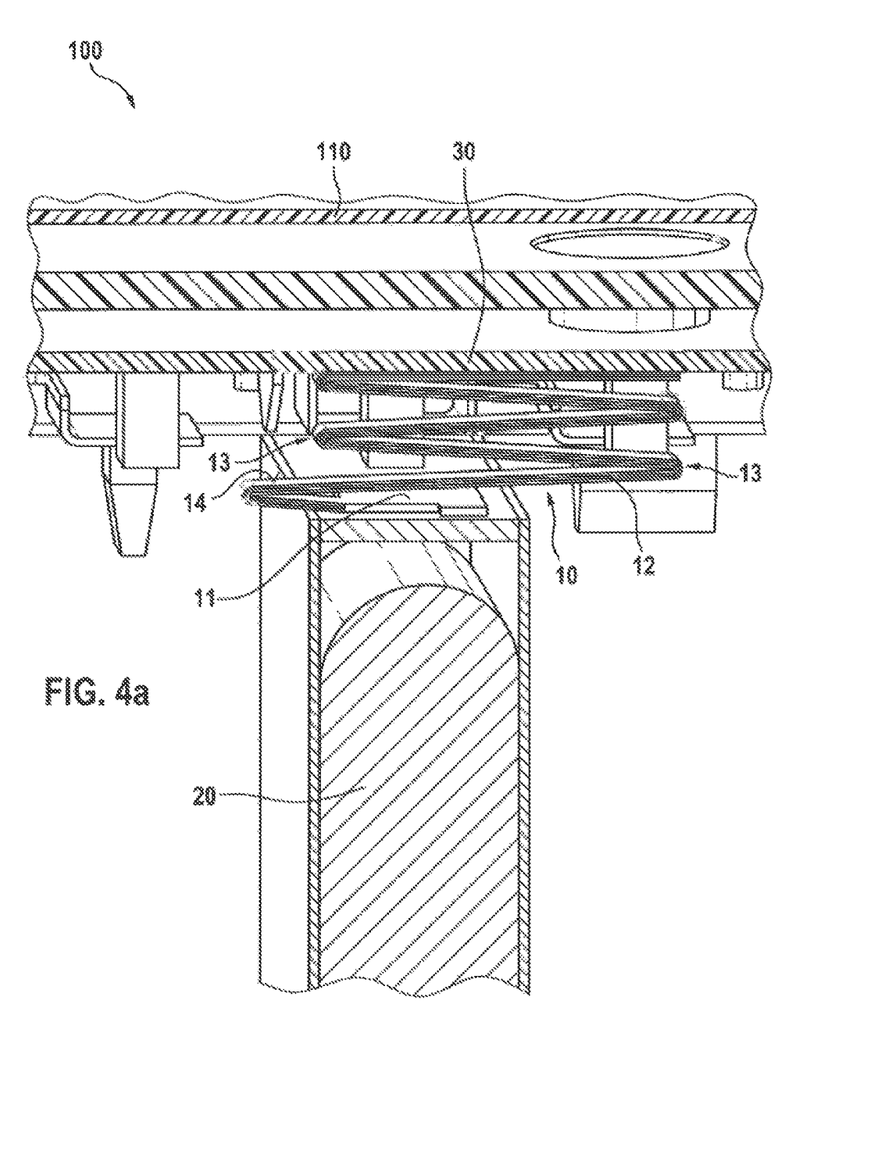
FIG. 4a shows one possible embodiment of a battery system according to the invention.

FIG. 4a depicts a further embodiment of a battery system 100 according to the invention. Here, the battery system 100 has a sensor apparatus 10 according to the invention in a further possible embodiment. An electronic unit 30 is arranged on a cover 110 of the battery system 100, wherein the flexible printed circuit board 12 is connected, in particular signal-connected, by way of its second end, preferably by means of a plug, to the electronic unit 30. Here, the flexible printed circuit board 12 is designed in a spiral-shaped and three-layered manner. In this case, the flexible printed circuit board 12, which is preferably formed with a plurality of cores, has the connecting element 12 in the form of a flexible printed circuit board, an insulation element 14 and a spring element 13. The spring element 13, the flexible printed circuit board 12 and the insulation element 14 are preferably formed in a force-fitting, material-bonded and/or form-fitting manner. A sensor element 11, which contacts the battery cell 20, is arranged at a first end of the flexible printed circuit board 12, which is of spiral form in FIG. 4a, with the result that state variables of the battery cell 20 can be transmitted to the electronic unit 30. In this case, the spring element 13 extends over the entire length of the connecting element 12, as a result of which said connecting element is of spiral form and makes a spring force possible so that the sensor element 11 can be brought into contact with the battery cell 20 and tolerances can be compensated.

Figure 4B:
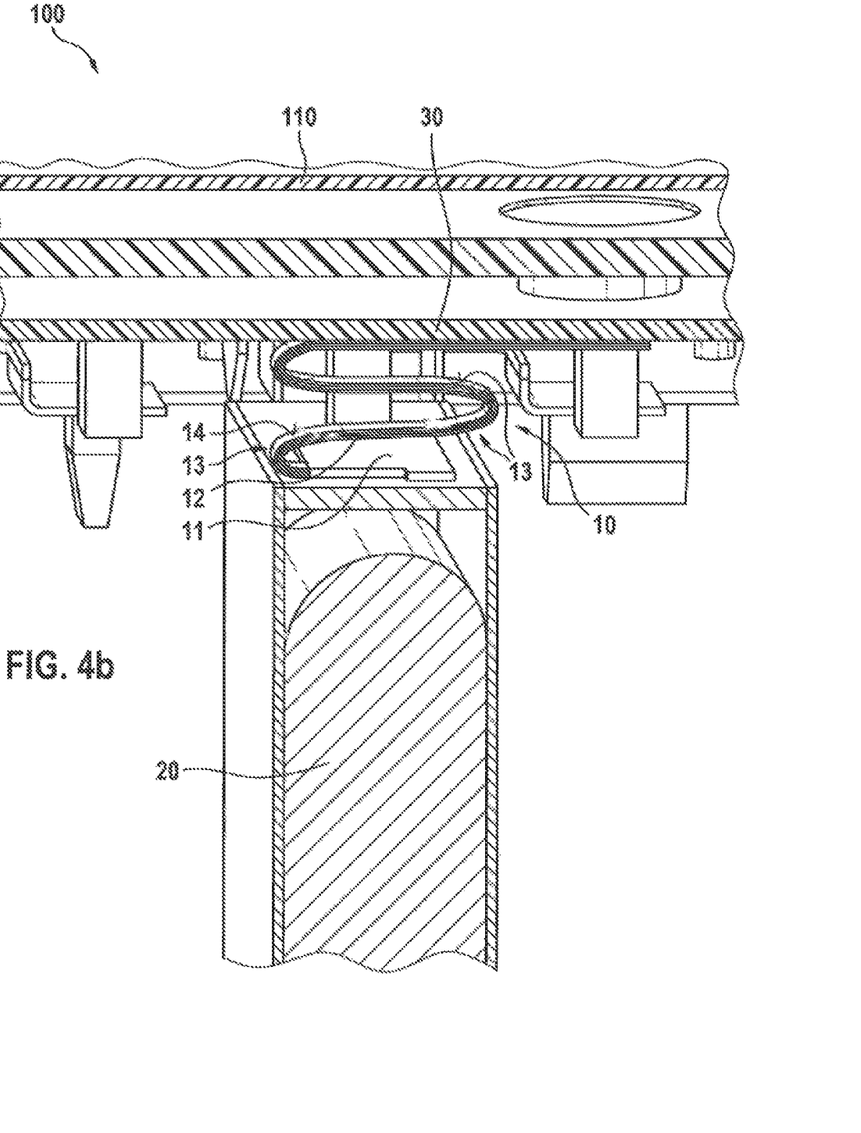
FIG. 4b shows a further possible embodiment of a battery system according to the invention.

FIG. 4b shows a further possible embodiment of a battery system 100 according to the invention comprising a further possible embodiment of a sensor apparatus 10 according to the invention. The flexible printed circuit board 12 can preferably be formed with a plurality of cores and, as shown in FIG. 4b, can be of s-shaped/helical form. The flexible printed circuit board 12 has at least one spring element 13, wherein the spring element 13 and the flexible printed circuit board 12 are formed in one piece. The spring element 13 and the flexible printed circuit board 12 are thus formed in a force-fitting, in particular a material-bonded and/or form-fitting manner. The helical spring element 13 forms a spring force so that the flexible printed circuit board 12 can press by way of a first end against the electronic unit 30 and by way of a second end against the battery cell 20. The flexible printed circuit board 12 is preferably connected at its first end to the electronic unit 30 by means of a plug.

Figure 5:
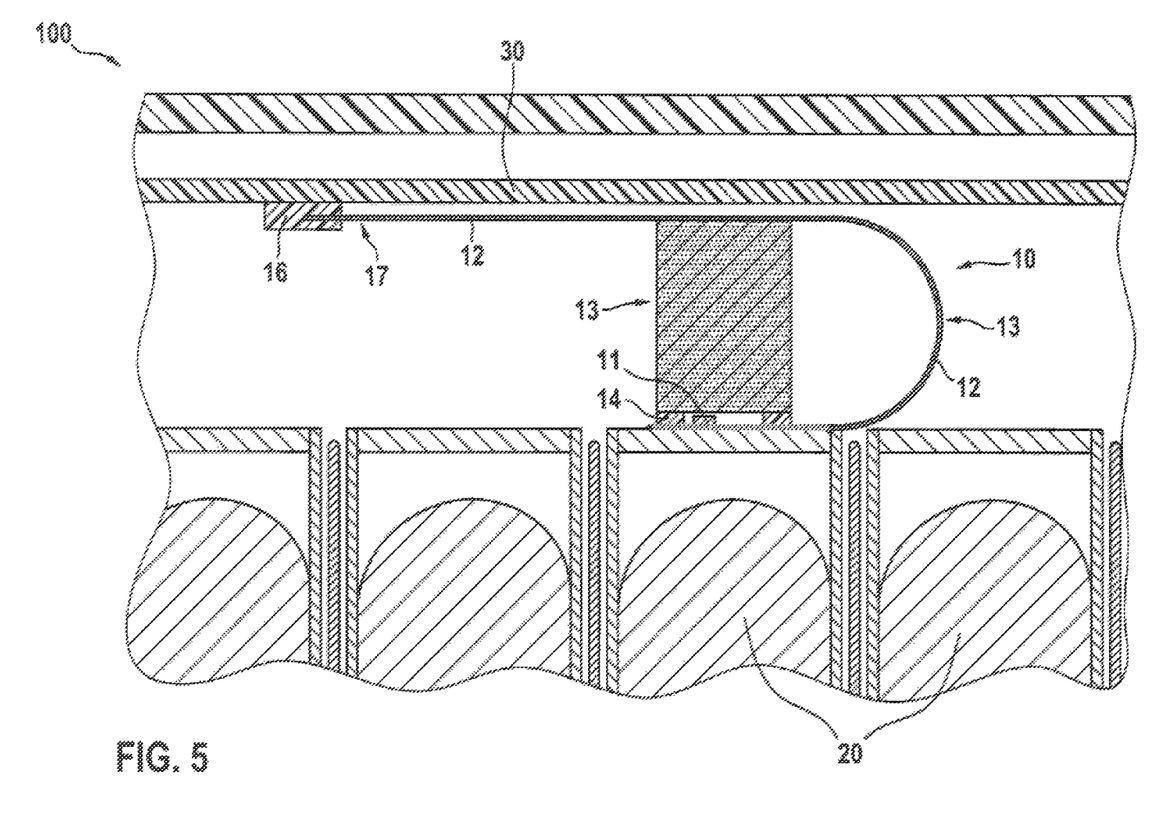
FIG. 5 shows a further possible embodiment of a sensor apparatus according to the invention.

FIG. 5 shows a further possible exemplary embodiment of a sensor apparatus 10 according to the invention in a battery system 100. In this case, the battery system 100 has a plurality of battery cells 20 (four are shown). The sensor apparatus is arranged on a battery cell 20 so that, in particular, the temperature of the battery cell 20 can be monitored. In FIG. 5, the flexible printed circuit board 12 is of bent form and has a curved portion, which acts as a first spring element 13. Furthermore, a second spring element 13 is arranged on the flexible printed circuit board 12, wherein the second spring element 13 is of foamed and cube form. In this case, the spring element 13 of foamed form is arranged on the flexible printed circuit board 12 in such a way that the sensor element 11 is pressed at least against the battery cell 20. In FIG. 5, an insulation element 14 is arranged in the region of the sensor element 11, between the foamed spring element 13 and the flexible printed circuit board 12. As a result, the sensor element 11 is arranged in a manner decoupled from the foamed spring element 13 and does not have a common contact face. According to the invention, it is conceivable for the foamed spring element 13 to be adhesively bonded, welded and/or latched to the flexible printed circuit board 12. The flexible printed circuit board 12 has a plug 16 at its one end 17, as a result of which the flexible printed circuit board 12 and the electronic unit 30 are connected to one another.

The above explanation of the embodiments describes the invention exclusively within the context of examples. It goes without saying that individual features of the embodiments can be combined freely with one another, insofar as technically appropriate, without departing from the scope of the present invention.

The invention claimed is:

1. A sensor apparatus (10) for monitoring at least one battery cell (20) of a battery system (100), the sensor apparatus comprising a sensor element (11) for detecting at least one state variable of the at least one battery cell (20), and at least one electrically and/or thermally conductive connecting element connected to the sensor element (11), the conductive connecting element being configured to press the sensor element onto the at least one battery cell (20) and being configured to connect the sensor element to an electronic unit (30) of the battery system (100), wherein the at least one connecting element is formed as a flexible printed circuit board (12).

2. The sensor apparatus (10) according to claim 1, characterized in that the flexible printed circuit board (12) has at least one spring element (13) configured to provide a restoring force that presses the sensor element (11) onto the at least one battery cell.

3. The sensor apparatus (10) according to claim 2, characterized in that the at least one spring element (13) and the flexible printed circuit board (12) are formed at least in a force-fitting, material-bonded and/or form-fitting manner.

4. The sensor apparatus (10) according to claim 2, characterized in that the flexible printed circuit board (12) and/or the at least one spring element (13) is of helical, spiral or z-shaped form.

5. The sensor apparatus (10) according to claim 1, characterized in that an insulation element (14) is provided so that at least the flexible printed circuit board (12) is at least electrically isolated.

6. The sensor apparatus (10) according to claim 1, characterized in that an insulation film (15) is arranged on the sensor element (11) so that the sensor element (11) is electrically and/or thermally insulated at least in sections.

7. The sensor apparatus (10) according to claim 2, characterized in that the at least one spring element (13) at least partly comprises foam material.

8. The sensor apparatus (10) according to claim 1, characterized in that the at least one conductive connecting element (12) has a plug (16) at least at one end (17) of the at least one conductive connecting element.

9. The sensor apparatus (10) according to claim 2, characterized in that the at least one spring element (13) and/or the flexible printed circuit board (12) has at least one latching connection (18), clip connection or clamping connection, so that the at least one spring element (13) and the flexible printed circuit board (12) can be connected in a force-fitting manner.

10. The sensor apparatus (10) according to claim 5, characterized in that the insulation element (14) comprises at least plastic and/or ceramic.

11. The sensor apparatus (10) according to claim 6, characterized in that the insulation film (15) comprises at least plastic and/or ceramic.

12. The sensor apparatus (10) according to claim 1, characterized in that the flexible printed circuit board (12) has at least one spring element (13), wherein the at least one spring element (13) and the flexible printed circuit board (12) are formed in one piece.

13. The sensor apparatus (10) according to claim 2, characterized in that an insulation element (14) is provided so that at least the flexible printed circuit board (12) is at least electrically isolated with respect to the at least one spring element (13).

14. The sensor apparatus (10) according to claim 1, characterized in that the at least one conductive connecting element (12) has a plug (16) at least at one end (17) of the at least one conductive connecting element, wherein at least one tool receptacle (16.1) is arranged on the plug (16).

15. The sensor apparatus (10) according to claim 1, wherein the at least one conductive connecting element is configured to compensate for a variation of spacing between the electronic unit (30) and the at least one battery cell (20).

16. The sensor apparatus (10) according to claim 1, wherein the at least one conductive connecting element is electrically conductive.

17. The sensor apparatus (10) according to claim 1, wherein the at least one conductive connecting element is thermally conductive.

18. A battery system (100) for storing electrical energy and for supplying electrical energy to an electric motor of a motor vehicle, the battery system comprising at least one battery cell (20), an electronic unit (30) configured to monitor the battery system (100) and at least one sensor apparatus (10) configured to monitor the at least one battery cell (20), the sensor apparatus having a sensor element (11) configured to detect a state variable of the at least one battery cell (20), and at least one electrically and/or thermally conductive connecting element connecting the sensor element (11) to an electronic unit (30) of the battery system (100), wherein the connecting element is formed as a flexible printed circuit board (12).

19. The sensor apparatus (10) according to claim 18, wherein the at least one conductive connecting element is electrically conductive.

20. The sensor apparatus (10) according to claim 18, wherein the at least one conductive connecting element is thermally conductive.

* * * * *